US012744540B2

(12) United States Patent
Wu et al.

(10) Patent No.: US 12,744,540 B2
(45) Date of Patent: Sep. 22, 2026

(54) SYSTEMS AND METHODS FOR FREQUENCY-DRIFT CORRECTION

(71) Applicant: Samsung Electronics Co., Ltd., Suwon-si (KR)

(72) Inventors: Jie Wu, San Diego, CA (US); Sigang Qiu, Sunnyvale, CA (US); Gary Lennen, Cupertino, CA (US); Paul Johnson, Iowa City, IA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 130 days.

(21) Appl. No.: 18/943,069

(22) Filed: Nov. 11, 2024

(65) Prior Publication Data

US 2025/0343555 A1 Nov. 6, 2025

Related U.S. Application Data

(60) Provisional application No. 63/643,300, filed on May 6, 2024.

(51) Int. Cl.
*H03M 1/06* (2006.01)
*H03M 1/12* (2006.01)

(52) U.S. Cl.
CPC ....... *H03M 1/0607* (2013.01); *H03M 1/1245* (2013.01)

(58) Field of Classification Search
CPC ........ H03M 1/06; H03M 1/12; H03M 1/1245; H03M 1/0607
See application file for complete search history.

(56) References Cited

U.S. PATENT DOCUMENTS

| | | | | |
|---|---|---|---|---|
| 4,212,027 A * | 7/1980 | Lemoine | H04N 9/896 348/498 |
| 6,324,308 B1 * | 11/2001 | Chen | H04N 23/20 348/E5.081 |
| 7,894,561 B1 * | 2/2011 | Buchanan | H03K 5/003 455/296 |
| 8,266,505 B2 * | 9/2012 | Liu | H03M 13/47 714/775 |
| 8,331,054 B1 * | 12/2012 | Han | G11B 20/10212 360/32 |
| 8,354,890 B2 | 1/2013 | Chang et al. | |

(Continued)

FOREIGN PATENT DOCUMENTS

| | | |
|---|---|---|
| CN | 102185561 A | 9/2011 |
| CN | 103401673 B | 2/2017 |
| CN | 108227471 B | 11/2019 |

*Primary Examiner* — Lam T Mai
(74) *Attorney, Agent, or Firm* — Womble Bond Dickinson (US) LLP

(57) ABSTRACT

A system and a method are disclosed for frequency-drift correction. The method includes receiving, by a sample-correction interface circuit, a digitized signal, receiving, by the sample-correction interface circuit, information associated with a crystal temperature, generating, by the sample-correction interface circuit, an uncorrected sample based on the digitized signal, generating, by the sample-correction interface circuit, crystal drift data associated with the digitized signal and the information associated with the crystal temperature, and sending, by the sample-correction interface circuit, at least one of the uncorrected sample or the crystal drift data to a memory.

20 Claims, 5 Drawing Sheets

(56) References Cited

U.S. PATENT DOCUMENTS 8,565,353 B1 * 10/2013 Madden ........... G11B 20/10268 375/345
9,501,664 B1 * 11/2016 Hamlet ................. H04L 9/0891
9,945,901 B1 * 4/2018 Otte .................... H03M 1/1042
10,147,466 B1 * 12/2018 Taylor ................. G11C 11/4072
10,291,439 B1 * 5/2019 Taylor .................. G11C 7/1048
2005/0026577 A1 * 2/2005 Chiu ................... H04L 27/2647 455/130
2007/0260945 A1 * 11/2007 Dunipace ........... G01R 31/3004 714/703
2011/0041028 A1 * 2/2011 Liu ........................... G06F 3/05 714/752
2012/0068866 A1 * 3/2012 Robinson ............ H03M 1/0836 341/118
2013/0321048 A1 * 12/2013 He .......................... G01S 19/37 327/156
2014/0268401 A1 * 9/2014 Zhang ................. G06F 12/0802 360/65
2015/0263747 A1 * 9/2015 Ramakrishnan .... H03M 1/1038 341/120
2015/0372681 A1 * 12/2015 Melanson ............... H03L 1/028 331/1 R
2020/0081769 A1 * 3/2020 Riho ..................... H03M 13/05
2021/0392600 A1 12/2021 Schmandt et al.
2023/0353328 A1 11/2023 Beale et al.

* cited by examiner

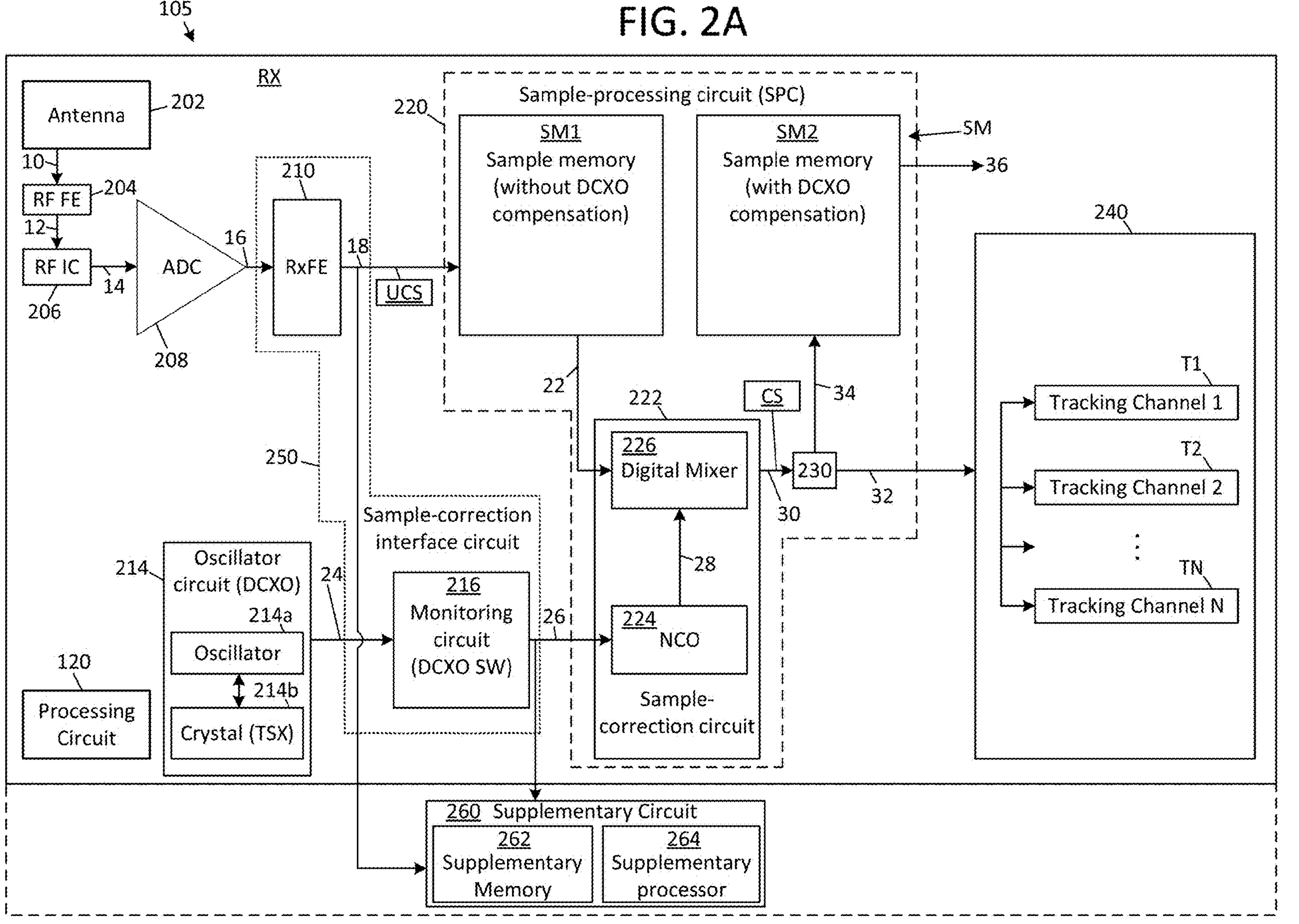
FIG. 2A
105
RX
Antenna
202
10
RF FE
204
12
RF IC
206
14
ADC
208
16
210
RxFE
18
UCS
220
Sample-processing circuit (SPC)
SM1
Sample memory (without DCXO compensation)
SM2
Sample memory (with DCXO compensation)
SM
36
22
222
226 Digital Mixer
CS
34
230
30
32
28
224 NCO
Sample-correction circuit
240
T1
Tracking Channel 1
T2
Tracking Channel 2
TN
Tracking Channel N
250
Sample-correction interface circuit
216 Monitoring circuit (DCXO SW)
24
26
214
Oscillator circuit (DCXO)
214a
Oscillator
214b
Crystal (TSX)
120
Processing Circuit
260 Supplementary Circuit
262 Supplementary Memory
264 Supplementary processor

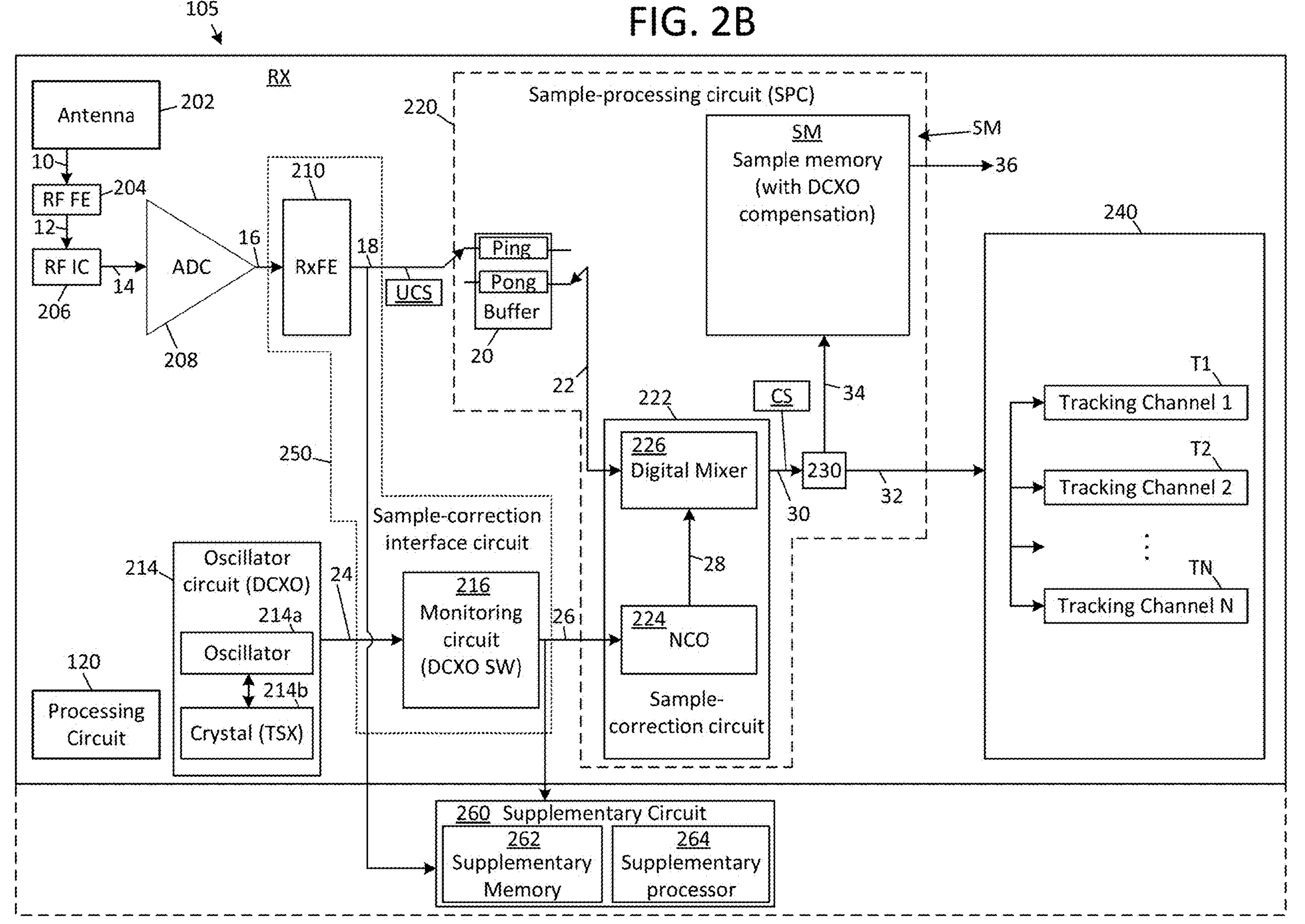
FIG. 2B
105
RX
Antenna
202
10
RF FE
204
12
RF IC
206
14
ADC
208
16
210
RxFE
18
UCS
220
Sample-processing circuit (SPC)
Ping
Pong
Buffer
20
22
SM
Sample memory
(with DCXO
compensation)
SM
36
240
T1
Tracking Channel 1
T2
Tracking Channel 2
TN
Tracking Channel N
222
CS
34
226
Digital Mixer
230
30
32
250
Sample-correction
interface circuit
214
Oscillator
circuit (DCXO)
214a
Oscillator
214b
Crystal (TSX)
24
216
Monitoring
circuit
(DCXO SW)
26
28
224
NCO
Sample-
correction circuit
120
Processing
Circuit
260 Supplementary Circuit
262
Supplementary
Memory
264
Supplementary
processor

FIG. 3

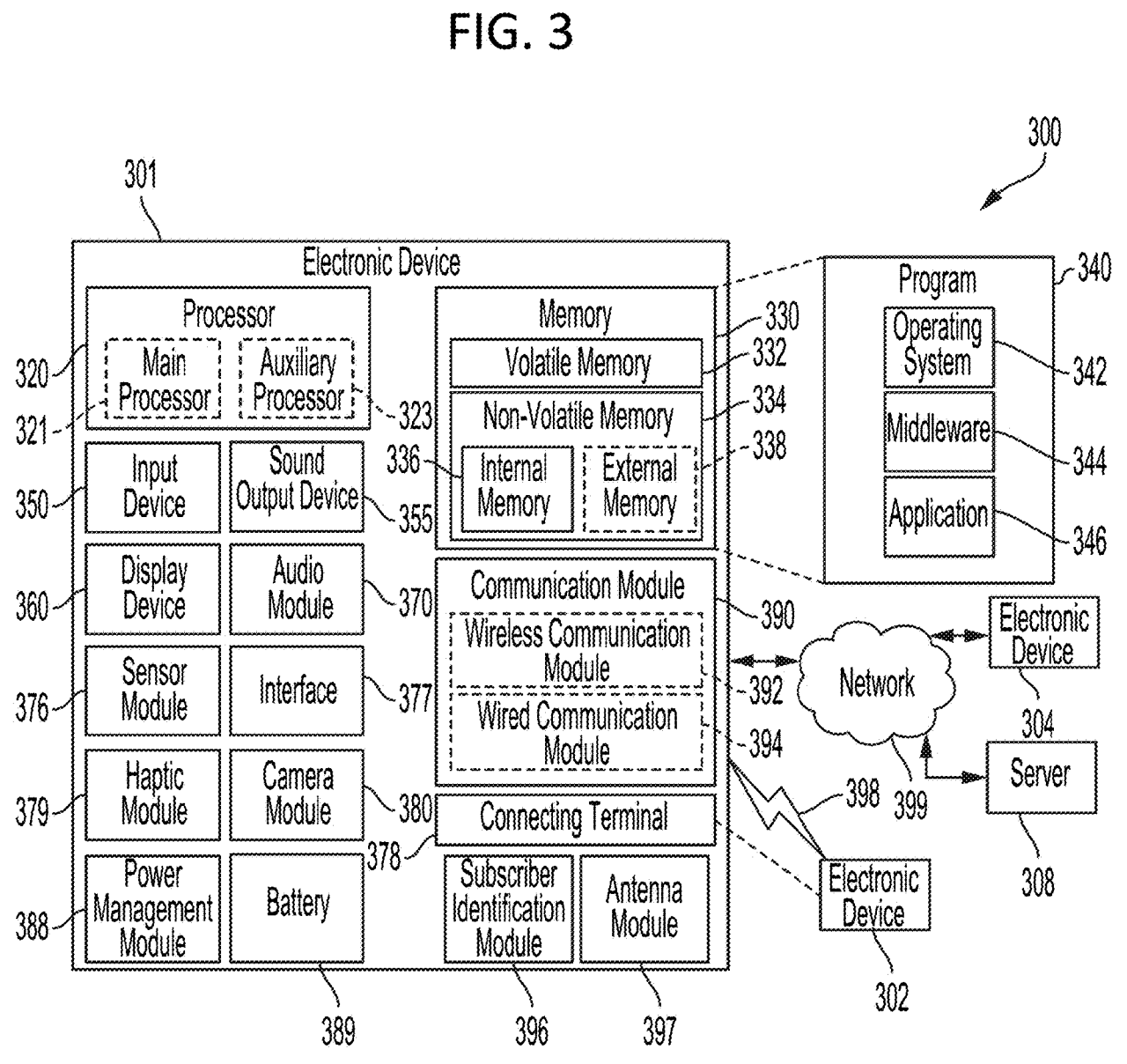

300
301 Electronic Device
320 Processor
321 Main Processor
323 Auxiliary Processor
330 Memory
332 Volatile Memory
334 Non-Volatile Memory
336 Internal Memory
338 External Memory
340 Program
342 Operating System
344 Middleware
346 Application
350 Input Device
355 Sound Output Device
360 Display Device
370 Audio Module
376 Sensor Module
377 Interface
378 Connecting Terminal
379 Haptic Module
380 Camera Module
388 Power Management Module
389 Battery
390 Communication Module
392 Wireless Communication Module
394 Wired Communication Module
396 Subscriber Identification Module
397 Antenna Module
398
399 Network
302 Electronic Device
304 Electronic Device
308 Server

SYSTEMS AND METHODS FOR FREQUENCY-DRIFT CORRECTION

CROSS-REFERENCE TO RELATED APPLICATION

This application claims the priority benefit under 35 U.S.C. § 119(e) of U.S. Provisional Application No. 63/643,300, filed on May 6, 2024, the disclosure of which is incorporated by reference in its entirety as if fully set forth herein.

TECHNICAL FIELD

The disclosure generally relates to wireless communications. For example, aspects of embodiments of the present disclosure relate to improved systems and methods for frequency-drift correction.

SUMMARY

Electronic devices (e.g., mobile devices) may include a hardware component to provide a reference clock for receiving, processing, and sending signals. Some reference clocks may include a temperature-compensated crystal oscillator (TCXO), which may have built-in circuitry that keeps the output frequency close to a constant frequency, even when there is a temperature change. Alternatively, some reference clocks may include a temperature sensing crystal (TSX). As used herein, the term "TSX" is used interchangeably with the term digitally controlled crystal oscillator (DCXO).

Using a TSX may have some advantages over using a TCXO. For example, a TSX may allow for: (1) lower cost; (2) lower phase noise; (3) lower power consumption; and (4) smaller board sizes. For example, a TSX may provide a suitable reference clock that works without a separate sleep crystal (e.g., without a separate 32 kHz sleep crystal), which would otherwise increase cost and consume additional board space.

One disadvantage of using a TSX for the reference clock is that the output frequency of the TSX may drift when there is a temperature change, causing a frequency drift (e.g., a local frequency drift). The local frequency drift may cause a local clock (e.g., a local oscillator) of the device to drift, which may cause a loss in sensitivity that may degrade the signal processing capabilities of the device. For example, the frequency drift may negatively affect the demodulation capabilities of a receiver of the device and generate bit errors.

Aspects of some embodiments of the present disclosure provide a mechanism for correcting local frequency drift to achieve suitable performance.

A digital receiver architecture may include at least three components: (1) a receiver digital front end (RxFE), also referred to as a front-end processor (FEP); (2) a sample memory (e.g., an input sample memory (ISM)); and (3) further signal processing and/or analysis components (e.g., a correlator, tracking channels, a demodulator, and/or a decoder). The RxFE may receive samples from an analog-to-digital converter (ADC). The RxFE may perform down-sampling and/or filtering and may output a resulting down-sampled-and-filtered signal to the sample memory. The sample memory may receive and hold (e.g., may store) the samples from the RxFE. For global navigation satellite system (GNSS) applications, a correlator and/or tracking channels may read the samples from the sample memory. Based on the samples, a device, via the correlator and/or tracking channels, may perform further processing and/or analysis. For example, the device may de-spread the signal, may perform acquisition operations, may perform tracking operations, and may obtain measurements associated with the acquisition operations and the tracking operations. For wireless-communication receiver applications, a demodulator and/or a decoder may perform further signal processing and/or analysis operations.

Some systems may correct for frequency drift in the RxFE. For example, some systems may use a programmable digital mixer in the RxFE, wherein firmware or software is used to program the mixer periodically to correct the frequency drift. Such systems may only allow for synchronous processing (also referred to as real-time processing or online processing).

Some systems may correct for frequency drift in the tracking channels. Such systems may correct the frequency drift in each tracking channel separately and independently, even though the frequency drift may be common to all the channels. Such systems may involve the use of more firmware or software without taking advantage of the frequency drift being common to all the tracking channels.

To overcome these issues, and to provide for further improvements, systems and methods are described herein to perform frequency-drift correction of samples at the output of the RxFE (e.g., before tracking channels of the device). For example, frequency-drift correction may be performed at the sample memory of a device, instead of being performed in the RxFE or in the tracking channels.

As used herein, the terms "correction," "compensation," and "removal" are used interchangeably and refer to removing a frequency drift, associated with TSX, from the samples.

In some embodiments, an estimated frequency drift (e.g., an estimated clock frequency drift) may be obtained as a function of a local clock time. In some embodiments, the estimated frequency drift may be determined based on DCXO data (e.g., based on a DCXO frequency versus temperature model and/or DCXO temperature vs. time data). In some embodiments, the estimated frequency drift may be determined based on aiding data from cellular technologies. In some embodiments, the estimated frequency drift may be determined based on both DCXO data and aiding data, in which case, the DCXO data and the aiding data may be combined to generate the estimated frequency drift.

In some embodiments, frequency-drift correction (e.g., sample correction) may be performed on data from a sample memory. For example, a block of data (e.g., a block of uncorrected samples), already in the sample memory, may be read out from the sample memory. A frequency rotation (also referred to as mixing) and a time adjustment (e.g., an interpolation operation) may be performed on the uncorrected samples, based on the DCXO data and/or the aiding data, to correct the time drift (e.g., to remove the frequency drift) and, thereby, generate corrected samples. After the processing (e.g., after the mixing), if needed, the corrected samples may be re-quantized (e.g., by a sample-processing circuit), to the original bit width of the input samples in the sample memory. The corrected samples may be written as new data back to the sample memory or may be written as new data to a different memory location. As used herein, "re-quantizing" refers to a process that may reduce a bit width of input samples and output the samples with a smaller bit width. For example, one or more input samples may have a bit width of 12 bits per sample, and a re-quantizer may truncate the lowest 8 bits and output only 4 bits per sample.

In some embodiments, sample correction may be performed synchronously (e.g., in real time or on-line) or asynchronously (e.g., in non-real time or offline). To support real-time processing, a "ping-pong" buffer may be used. For example, the ping-pong buffer may allow for parallel computing by receiving new samples (e.g., sample data) into a first buffer (e.g., a first portion of a memory buffer) and processing (e.g., simultaneously processing) previously received data from a second buffer (e.g., a second portion of the memory buffer). To support offline processing, a sample memory may be used. For example, the sample buffer may allow for offline computing by storing new samples and sending the samples to an external computer for deeper analysis and more powerful processing capabilities. Offline computing may be used to support a software-defined radio (e.g., a software GNSS receiver) and related non-real-time positioning applications. Asynchronous processing may also be used to support lab and factory tests.

The above approaches may improve on previous methods because aspects of some embodiments of the present disclosure may: (i) allow for frequency-drift correction to be flexibly performed in real time or offline; (ii) be easily implemented into existing RxFE hardware designs (unlike systems that perform frequency-drift correction in the RxFE); and (iii) be implemented based on simplified software compared to systems that perform frequency-drift correction in the tracking channels.

According to some embodiments of the present disclosure, a method for frequency-drift correction includes receiving, by a sample-correction interface circuit, a digitized signal, receiving, by the sample-correction interface circuit, information associated with a crystal temperature, generating, by the sample-correction interface circuit, an uncorrected sample based on the digitized signal, generating, by the sample-correction interface circuit, crystal drift data associated with the digitized signal and the information associated with the crystal temperature, and sending, by the sample-correction interface circuit, at least one of the uncorrected sample or the crystal drift data to a memory.

The sample-correction interface circuit may receive the information associated with the crystal temperature from an output of an oscillator circuit, and the uncorrected sample may be generated by a receiver digital front end (RxFE) of the sample-correction interface circuit.

The digitized signal may be received from an analog-to-digital converter (ADC) of the sample-correction interface circuit, and the crystal drift data may include crystal temperature data or a crystal drift value.

The memory may include a sample memory of a receiver including the sample-correction interface circuit.

The memory may include a supplementary memory that is external to a receiver including the sample-correction interface circuit.

The method may further including generating, by the sample-correction interface circuit, time-alignment data, sending, by the sample-correction interface circuit, the time-alignment data to the memory, receiving, by a sample-correction circuit, the uncorrected sample from the memory, and generating, by the sample-correction circuit, a corrected sample based on the uncorrected sample.

The method may further including re-quantizing, by a sample-processing circuit, the corrected sample to a bit width of the memory.

The method may further including sending, by a sample-processing circuit, the corrected sample to a tracking channel.

The sample-correction circuit may receive the uncorrected sample from a ping-pong buffer communicatively coupled to a receiver digital front end (RxFE) of the sample-correction interface circuit.

The method may further include sending, by the sample-correction interface circuit, the uncorrected sample and data indicating a frequency drift to a sample-correction circuit that is external to a device including the sample-correction interface circuit.

The frequency drift may be determined as a function of a local clock time of the device.

According to other embodiments of the present disclosure, a device for frequency-drift correction includes a processing circuit, and a crystal communicatively coupled to the processing circuit, wherein the processing circuit is configured to perform receiving a digitized signal, receiving information associated with a temperature of the crystal, generating an uncorrected sample based on the digitized signal, generating crystal drift data associated with the digitized signal and the information associated with the temperature of the crystal, and sending at least one of the uncorrected sample or the crystal drift data to a memory.

The uncorrected sample may be generated by a receiver digital front end (RxFE).

The digitized signal may be received from an analog-to-digital converter (ADC).

The memory may include a sample memory of a receiver, or a supplementary memory that is external to the receiver.

The processing circuit may be configured to perform generating time-alignment data, sending the time-alignment data to the memory, receiving the uncorrected sample from the memory, and generating a corrected sample based on the uncorrected sample.

The processing circuit may be configured to perform re-quantizing the corrected sample to a bit width of the memory.

The processing circuit may be configured to perform sending the corrected sample to a tracking channel.

The processing circuit may receive the uncorrected sample from a ping-pong buffer communicatively coupled to a receiver digital front end (RxFE).

According to other embodiments of the present disclosure, a system for frequency-drift correction includes a processing circuit, and a memory communicatively coupled to the processing circuit, and storing instructions that, when executed by the processing circuit, cause the processing circuit to perform receiving a digitized signal, receiving information associated with a crystal temperature, generating an uncorrected sample based on the digitized signal, generating crystal drift data associated with the digitized signal and the information associated with the crystal temperature, and sending at least one of the uncorrected sample or the crystal drift data to a memory.

BRIEF DESCRIPTION OF THE DRAWING

In the following section, the aspects of the subject matter disclosed herein will be described with reference to exemplary embodiments illustrated in the figures.

FIG. 2A is a diagram depicting components for asynchronous frequency-drift correction, according to some embodiments of the present disclosure.

FIG. 2B is a diagram depicting components for synchronous frequency-drift correction, according to some embodiments of the present disclosure.

FIG. 3 is a block diagram of an electronic device in a network environment 300, according to an embodiment.

DETAILED DESCRIPTION

Figure 1:
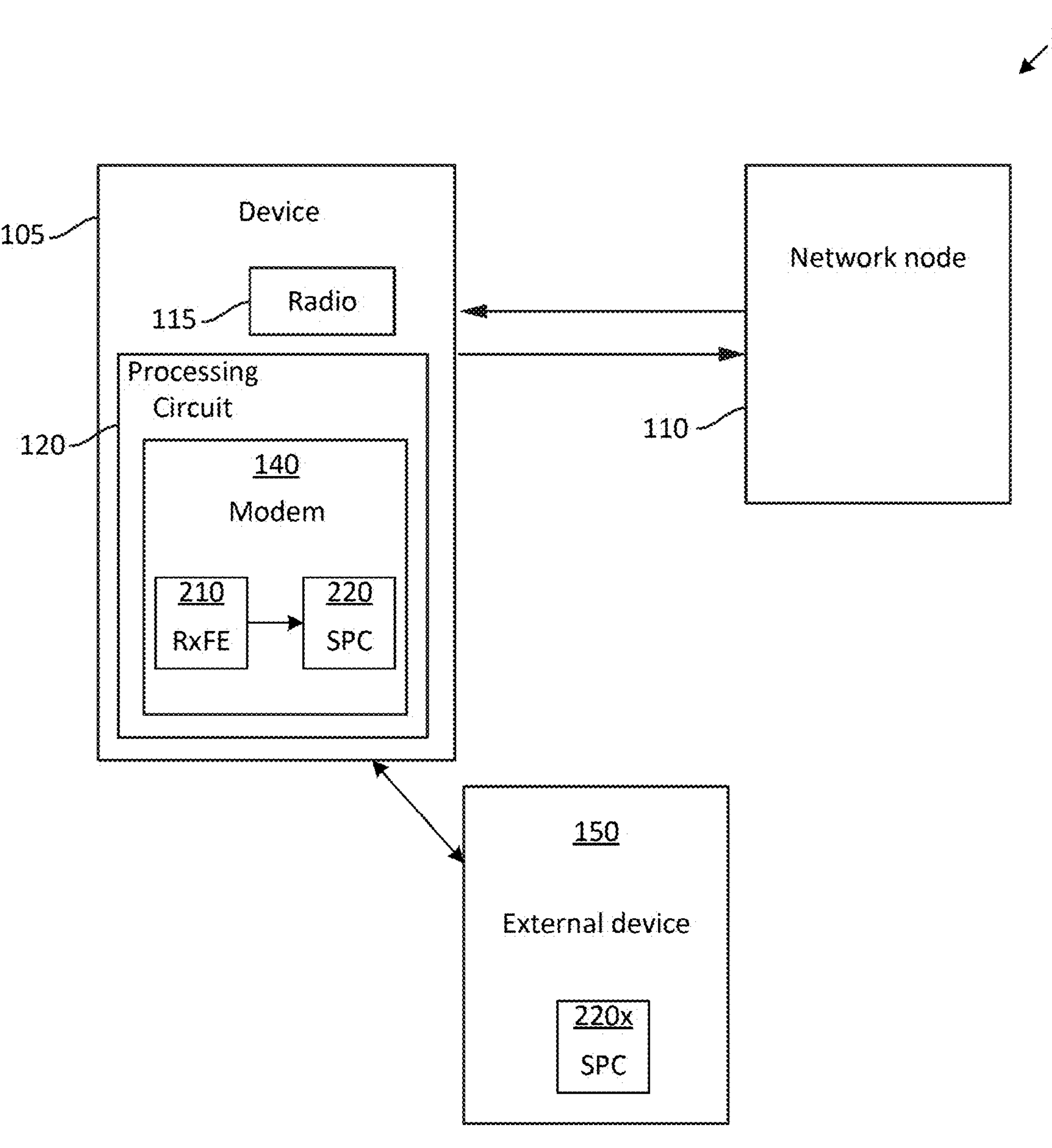
FIG. 1 is a block diagram depicting a system for frequency-drift correction, according to some embodiments of the present disclosure.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

A person of ordinary skill in the art would appreciate, in view of the present disclosure in its entirety, that each suitable feature of the various embodiments of the present disclosure may be combined or combined with each other, partially or entirely, and may be technically interlocked and operated in various ways, and each embodiment may be implemented independently of each other or in conjunction with each other in any suitable manner unless otherwise stated or implied.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the terms "or" and "and/or" include any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

FIG. 1 is a block diagram depicting a system for frequency-drift correction, according to some embodiments of the present disclosure.

Referring to FIG. 1, the system 1 may include a device 105 (e.g., a UE or a global navigation satellite system (GNSS) receiver) and a network node 110 (e.g., a base station or a satellite), in communication with each other. For example, in some embodiments, the system 1 may include a UE (e.g., a cellular device) in communication with a base station (e.g., a gNB). A UE may include a communications device (e.g., a vehicle, a mobile phone, a satellite, a tablet, a personal computer, a navigation device, a game console, and the like). In some embodiments, the system 1 may include a GNSS receiver in communication with a satellite (e.g., a GPS satellite, a Galileo satellite, or a BeiDou satellite). As used herein, "in communication with" refers to both one-way and two-way communications. For example, the device 105 may only receive communications from the network node 110 or the device 105 may also transmit communications to the network node 110. The device 105 may correspond to an electronic device 301 of FIG. 3. The UE may include a radio 115 and a processing circuit 120 (or a means for processing), which may perform various methods disclosed herein, e.g., the method illustrated in FIG. 4. For example, the processing circuit 120 may receive, via the radio 115, transmissions from the network node 110, and the processing circuit 120 may transmit, via the radio 115, signals to the network node 110.

The device 105 may include a modem 140. The modem 140 may be associated with the processing circuit 120. The modem 140 may be associated with signal-processing components for signals received from the network node 110. For example, the modem 140 may be associated with a receiver digital front end (RxFE) 210 and a sample-processing circuit (SPC) 220 (e.g., a sample-processing module). As discussed in further detail below, and according to some embodiments of the present disclosure, the sample-processing circuit 220 may receive samples from the output of the RxFE 210 and may perform frequency-drift correction on the samples by removing a frequency drift from the samples to generate corrected samples. The device 105 may perform an operation based on the corrected samples.

In some embodiments, the system 1 may include an external device 150 (e.g., a remote device). The external device 150 may include computing resources that are separate and distinct from the computing resources of the device 105. For example, the external device 150 may include an external computer (e.g., an external server) having more memory and more powerful processing capabilities than those of the device 105, which may allow the external device 150 to perform a deeper analysis of samples generated at the device 105. For example, the external device 150 may be capable of performing an analysis based on more data collected over a longer period of time than the device 105. In some embodiments, the external device 150 may include an external sample-processing circuit **220*x* to receive samples from the RxFE 210 and perform frequency-drift correction externally from the device 105. The external device 150 may correspond to the electronic device 301 of FIG. 3**.

FIG. 2A is a diagram depicting components for asynchronous frequency-drift correction, according to some embodiments of the present disclosure.

Referring to FIG. 2A, the device 105 may include a receiver RX. The receiver RX may include a plurality of components for receiving and processing signals received by an antenna 202. For example, the device 105 may include front-end analog components. The front-end analog components may include the antenna 202, a radio-frequency front end (RF FE) 204, and a radio-frequency integrated circuit (RF IC) 206. An antenna output 10 may be communicatively coupled to the RF FE 204 to provide a received analog signal from the network node 110 (see FIG. 1) to the RF FE 204. An RF-FE output 12 may be communicatively coupled to the RF IC 206 to provide a processed version of the received analog signal to the RF IC 206. For example, the RF FE 204 may include a low-noise amplifier (LNA) to boost the received analog signal above a noise level. The RF IC 206 may include an analog mixer and intermediate-frequency (IF) processing components (e.g., a baseband filter, etc.) to further process the received analog signal. An RF-IC output 14 may be communicatively coupled to an analog-to-digital converter (ADC) 208 for converting the processed received analog signal to a digital signal. An ADC output 16 may be communicatively coupled to the RxFE 210 for digital-signal processing. For example, the ADC 208 may provide a digital version of the received analog signal (e.g., a digitized signal) for further processing.

The RxFE 210 may generate samples (e.g., digital samples of the received signal) based on the ADC output 16 (e.g., based on the digitized signal). The samples may be associated with a frequency of an oscillator circuit 214 (e.g., a digitally controlled crystal oscillator (DCXO)). For example, the oscillator circuit 214 may provide (e.g., may serve as) a local reference clock for the device 105. The oscillator circuit 214 may include an oscillator **214*a* and a crystal 214*b* (e.g., a TSX). Accordingly, a frequency drift associated with the oscillator circuit 214 (e.g., associated with oscillator-circuit temperature changes) may cause a frequency drift to occur in the samples generated by the RxFE 210. An RxFE output 18 may be communicatively coupled to the sample-processing circuit 220 for further processing of the samples from the RxFE 210. Samples having a frequency drift may be referred to as uncorrected samples UCS. The RxFE output 18 may be communicatively coupled to a sample-correction circuit 222 (e.g., a sample-correction module) to remove the frequency drift and, thereby, generate corrected samples CS. As used herein, a "sample-correction circuit" refers to a component comprising hardware and/or software (e.g., software executed on a processing circuit) that receives uncorrected samples (e.g., samples having a frequency drift) and outputs corrected samples (e.g., samples not having the frequency drift). The corrected samples CS may be used by the device 105** or by another device for further processing, analysis, and/or tracking.

In some embodiments, a sample-correction output 30 may be configured to provide the corrected samples CS to a memory for use by one or more applications. For example, the corrected samples CS may be used to perform a phase-noise-analysis operation or to perform a receiver-aiding operation. As used herein, a "receiver-aiding operation" refers to any operation that may assist the device 105 or another device in performing processing based one or more samples (e.g., based on one or more uncorrected samples UCS and/or based on one or more corrected samples CS). For example, an aiding processor, such as a CPU or a GPU (e.g., a powerful CPU or a powerful GPU) in the same device 105, or in a different device may perform receiver-aiding operations in cooperation with the device 105. The aiding processor may use the samples to acquire GNSS signals and compute a position. In some embodiments, the position results may then be provided to the device 105 as aiding data, which may improve the performance of the device 105 (e.g., by enabling a faster position fix). In some embodiments, the aiding processor may be located in a different device (e.g., in a server computer). For example, a server that is separate and distinct from the device 105 may compute a position of the device 105 on a cloud (e.g., on remote computing resources) associated with the device 105. In some embodiments, a segment of data from the sample memory SM may be sent to a cloud server (e.g., a CPU in a different device) via a communication link, so that the cloud server can acquire GNSS signals from the data of the sample memory SM and compute, on the cloud server, a position fix. The position result may be sent back to the device 105 (e.g., for use by a local application) or may be consumed (e.g., processed) at the cloud server for remote applications (e.g., an asset tracker). For example, an asset-tracker application may be implemented without the device 105 knowing (e.g., storing or using) the position of the device 105. In an asset-tracker application, the position of the device 105 may be used by (e.g., provided to) a monitoring server. In some embodiments, the position of the device 105 may be provided to the monitoring server periodically.

In some embodiments, the sample-correction circuit 222 may be configured to provide the corrected samples CS to a tracking section 240 to perform a tracking operation. For example, the tracking section 240 may include one or more tracking channels (e.g., a first tracking channel TI through an n-th tracking channel TN). In some embodiments, the sample-correction output 30 may be communicatively coupled to a switch 230 to selectively send the corrected samples CS for further processing. For example, the switch 230 may communicatively couple the sample-correction output 30 to a second sample memory SM2 (e.g., a second portion of the sample memory SM) via a corrected-sample-memory input 34. A corrected-sample-memory output 36 may send the corrected samples CS for further processing. The switch 230 may also communicatively couple the sample-correction output 30 to the tracking section 240 via a tracking-section input 32.

In some embodiments, a re-quantizer may be located between the digital mixer 226 and the switch 230 to perform re-quantization on the corrected samples CS. For example, the corrected samples CS output from the digital mixer 226 may be truncated by a re-quantizer to have a smaller bit width before the corrected samples CS are written into the second sample memory SM2. The corrected samples CS may be re-quantized to save memory and to be the same bit width as the uncorrected samples UCS.

In some embodiments, the RxFE output 18 may be provided to a sample memory SM. For example, the uncorrected samples UCS may be stored on a first sample memory SM1 (e.g., a first portion of the sample memory SM) before being provided to the sample-correction circuit 222 for frequency-drift correction. Storing the uncorrected samples UCS in the sample memory SM may allow for asynchronous processing and/or analysis of the uncorrected samples UCS. In some embodiments, the sample memory SM may include random-access memory (RAM). For example, a portion of a RAM of the device 105 may be used to serve as the sample memory SM. In some embodiments, a first sample-memory output 22 may be communicatively coupled to the sample-correction circuit 222 to enable the sample-correction circuit 222 to read the uncorrected samples UCS from the sample memory SM for frequency-drift correction. The uncorrected samples UCS may be input to a digital mixer 226 of the sample-correction circuit 222.

An oscillator-circuit output 24 may be communicatively coupled to the sample-processing circuit 220 for frequency drift detection. For example, a monitoring circuit 216 (e.g., DCXO software) may determine a frequency drift associated with the oscillator circuit 214 based on one or more characteristics of the oscillator circuit 214. For example, the monitoring circuit 216 may estimate a frequency drift based on a change in temperature associated with the oscillator circuit 214. For example, the oscillator-circuit output 24 may include information associated with one or more crystal temperatures (e.g., the crystal temperatures or information derived from the crystal temperatures). The monitoring circuit 216 may refer to a log (e.g., a DCXO log or table) comprising temperature measurements (e.g., crystal-temperature data), time-alignment data (e.g., timestamps), and corresponding frequencies. For example, in some embodiments, the monitoring circuit 216 may include software (e.g., DCXO software) and circuitry to periodically provide (e.g., to periodically store) temperature-reading samples associated with the crystal 214*b*. The temperature-reading samples may also be associated with the ADC output 16. The monitoring circuit 216 may associate clock-drift information (e.g., clock frequency-drift information) with first time-stamp data (e.g., with A time stamps), based on the temperature-reading samples being associated with the first time-stamp data (e.g., with the A time stamps). In some embodiments, the temperature-reading samples may be sampled at a given sampling rate (e.g., about 30 Hz to about 60 Hz). The uncorrected samples UCS in the sample memory SM may be time indexed with second time-stamp data (e.g., with B time stamps). To correct a frequency drift associated with the uncorrected samples UCS in the sample memory SM, the clock-drift information from the monitoring circuit 216 may be time aligned with the uncorrected samples UCS in the sample memory SM. The A time stamps may be associated with a first clock (e.g., a real-time clock in the receiver RX), while the B time stamps may be associated with a second clock (e.g., an acquisition clock counter (acqCnt)). The first clock and the second clock may have different clock rates. To time align the uncorrected samples UCS with the clock-drift information, each value of the A time stamps may be mapped to a corresponding value of the B time stamps. The clock-drift information, the uncorrected samples UCS, and time-alignment information (e.g., the mapping between the A time stamps and the B time stamps) may be sent to the sample-processing circuit 220 and/or to a supplementary circuit 260 for further processing.

In some embodiments, an acquisition clock drives the samples in the sample memory SM. The acquisition clock counter (acqCnt) may be a counter that is clocked by the acquisition clock. For example, the acquisition clock counter (acqCnt) may count the cycles of the acquisition clock. The acquisition clock counter (acqCnt) may be used to label an index of the samples in the sample memory SM. For example, for the first 100 samples in the sample memory SM, their corresponding acquisition clock counter (acqCnt) values may be 1, 2, 3, . . . , 99, 100.

A monitoring-circuit output 26 may be communicatively coupled to the sample-correction circuit 222 (e.g., to a numerically controlled oscillator (NCO) 224 of the sample-correction circuit 222). The NCO 224 may receive data indicating the frequency drift from the monitoring circuit 216. The NCO 224 may have the same drift rate (e.g., the same frequency drift) as the oscillator circuit 214 and may generate a local-clock signal for the digital mixer 226 based on the frequency drift. An NCO output 28 may be communicatively coupled to the digital mixer 226 to cancel out (e.g., to remove) the frequency drift from the uncorrected samples UCS, which are also provided to the digital mixer 226. In some embodiments, the NCO 224 and the digital mixer 226 may be implemented in software.

In some embodiments, the RxFE 210 and the monitoring circuit 216 may be referred to as components of a sample-correction interface circuit 250 (e.g., sample-correction interface circuitry). The sample-correction interface circuit 250 may receive the digitized signal from the ADC 208 and may receive an output of the oscillator circuit 214. The sample-correction interface circuit 250 may output the uncorrected samples UCS (e.g., based on the RxFE output 18) and may output data from the monitoring circuit 216 (e.g., based on the monitoring-circuit output 26). For example, the sample-correction interface circuit 250 may generate frequency data, time-alignment data, and crystal drift data associated with the digitized signal. As used herein, "crystal drift data" refers to data associated with determining a clock drift. For example, the crystal drift data may include crystal temperature data (e.g., in degrees Celsius) and/or a crystal drift value (e.g., in Hz). The frequency data, the time-alignment data, and the crystal-temperature data may be associated with the digitized signal based on being time aligned with the digitized signal and the uncorrected samples UCS. The sample-correction interface circuit 250 may output the uncorrected samples UCS, the time-alignment data, the crystal-temperature data, the frequency data, and/or data indicating a frequency drift (e.g., a frequency drift determined based on the time-alignment data and the crystal-temperature data). For example, the sample-correction interface circuit 250 may send the clock-drift information, the uncorrected samples UCS, and/or time-alignment information, discussed above. The sample-correction interface circuit 250 may send its output to other components internal to the receiver RX or external to the receiver RX for further processing. It should be understood that the sample-correction interface circuit 250 refers to one or more components associated with performing the functions described as being provided by the sample-correction interface circuit 250. For example, in some embodiments, the circuitry for receiving a digital signal (e.g., RxFE 210), the circuitry for receiving the oscillator-circuit output 24 (e.g., the monitoring circuit 216), and the circuitry for sending the data to a memory (e.g., the RxFE output 18 and the monitoring-circuit output 26), may be separate and distinct components or may be integrated into a single component.

For example, the sample-correction interface circuit 250 may send its output to a memory (e.g., the sample memory SM) of the receiver RX. In some embodiments, the sample-correction interface circuit 250 may send its output to a supplementary memory 262 of the supplementary circuit 260 that is external to the receiver RX. In some embodiments, the supplementary circuit 260 may be in the device 105. In some embodiments, the supplementary circuit 260 may be external to the device 105. For example, in some embodiments, the supplementary circuit 260 may correspond to the external device 150 of FIG. 1. In some embodiments, the supplementary circuit 260 may include a supplementary processor 264 for further processing the output from the sample-correction interface circuit 250. In some embodiments, the supplementary processor 264 may include an application processor (AP) of the device 105. In some embodiments, the supplementary processor 264 may include any other suitable processor known to one of ordinary skill in the art for processing samples from a receiver. In some embodiments, the supplementary circuit 260 may allow for more accurate correction of frequency drift at any time. For example, the supplementary circuit 260 may be able to determine a frequency drift based on a greater number of samples (e.g., a greater number of uncorrected samples UCS) than could be suitably stored and processed in the receiver RX.

In some embodiments, an external server may be enabled to perform signal processing (e.g., frequency-drift correction) for the device 105. As discussed above, the sample memory SM (e.g., the first sample memory SM1) may allow for offline processing of the uncorrected samples UCS. For example, in some embodiments, one or more functions of one or more of the monitoring circuit 216, the NCO 224, and the digital mixer 226 may be provided externally from the device 105 (e.g., may be provided to the external device 150 depicted in FIG. 1) to perform frequency-drift correction, analysis, and/or further processing. In such embodiments, the uncorrected samples UCS and the monitoring-circuit output 26 may be sent to the external device 150 to perform the frequency-drift correction, analysis, and/or further processing.

In some embodiments, the following pseudocode, or any suitable algorithm known to one of ordinary skill in the art, may be used, by the sample-correction circuit 222, to remove the frequency drift from uncorrected samples UCS (equation 1):

```
clkFreq[k]: clock phase increment (in cycle) per sample
ncoPhase[0]=0;
for k=1: N
  ISM_orig[k]=ISM_orig_I[k]+j*ISM_orig_Q[k];
  ncoPhase[k]=ncoPhase[k−1]+clkFreq[k];
  ISM_corrected[k]=ISM_orig[k]*exp(−
    j*2*pi*ncoPhase[k]);
end
```

wherein k refers to a sample index, clkFreq[k] refers to clock phase increment (in cycle) per sample, ncoPhase[0] refers to carrier NCO phase at sample index=0, ISM_orig[k] refers to uncorrected sample ISM sample complex value at sample index=k (ISM referring to input sample memory (e.g., sample memory SM)), ISM_orig_I[k] refers to uncorrected sample ISM sample I-component value at sample index=k, j*ISM_orig_Q[k] refers to uncorrected sample ISM sample Q-component value at sample index=k, ncoPhase[k] refers to carrier NCO phase at sample index=k, ncoPhase[k−1] refers to carrier NCO phase at sample index=k−1, ISM_corrected[k] refers to ISM sample (after correction) complex value at sample index=k, and exp (−j*2*pi*ncoPhase[k]) refers to carrier NCO output complex value at sample index=k.

In some embodiments, the uncorrected samples UCS may first be stored in the sample memory SM and then captured into a data file, then software of the sample-processing circuit 220 may read the data file and perform frequency-drift correction in a processor (e.g., processing circuit 120). The corrected samples CS may be stored in a memory, accessible to the processor, and used by the processor in a software-defined radio (e.g., a software GNSS receiver). Alternatively, or in addition, a post-processing tool in a computer (e.g., a matrix-based calculation tool) may read the data file, perform the correction, and then perform further analysis (e.g., a phase-noise analysis).

FIG. 2B is a diagram depicting components for synchronous frequency-drift correction, according to some embodiments of the present disclosure.

Referring to FIG. 2B, in some embodiments, frequency-drift correction may be performed on the uncorrected samples UCS before they are stored in the sample memory SM (e.g., frequency-drift correction may be performed in real time). In some embodiments, real-time frequency-drift correction (e.g., synchronous frequency-drift correction) may be supported by hardware (e.g., by dedicated hardware), or by a software driver, that accepts the RxFE output 18, runs frequency-drift correction, and then generates a data file including the corrected samples CS. In such embodiments, the corrected samples CS may be written into the sample memory SM directly.

As discussed above, in some embodiments, a buffer 20 (e.g., a ping-pong buffer) may be provided between the RxFE output 18 and the digital mixer 226 to provide efficient parallel processing of uncorrected samples UCS. For example, new uncorrected samples UCS may be saved to the ping portion of the buffer 20 as previously saved uncorrected samples UCS are processed based on the pong portion of the buffer 20.

In summary, the device 105 (e.g., by way of the processing circuit 120) may: determine a drift (e.g., a frequency drift) associated with the oscillator circuit 214 by looking up data (e.g., temperature vs. frequency data) in a table; apply the drift to the uncorrected samples UCS from the sample memory SM or as they come into the sample memory SM to generate corrected samples CS, synchronously or asynchronously; and send the corrected samples CS to tracking channels or to a memory (e.g., a storage) for use by other applications.

FIG. 3 is a block diagram of an electronic device in a network environment 300, according to an embodiment.

Referring to FIG. 3, the electronic device 301 in a network environment 300 may communicate with an electronic device 302 via a first network 398 (e.g., a short-range wireless communication network), or an electronic device 304 or a server 308 via a second network 399 (e.g., a long-range wireless communication network). The electronic device 301 may communicate with the electronic device 304 via the server 308. The electronic device 301 may include a processor 320, a memory 330, an input device 350, a sound output device 355, a display device 360, an audio module 370, a sensor module 376, an interface 377, a haptic module 379, a camera module 380, a power management module 388, a battery 389, a communication module 390, a subscriber identification module (SIM) card 396, or an antenna module 397. In one embodiment, at least one (e.g., the display device 360 or the camera module 380) of the components may be omitted from the electronic device 301, or one or more other components may be added to the electronic device 301. Some of the components may be implemented as a single integrated circuit (IC). For example, the sensor module 376 (e.g., a fingerprint sensor, an iris sensor, or an illuminance sensor) may be embedded in the display device 360 (e.g., a display).

The processor 320 may execute software (e.g., a program 340) to control at least one other component (e.g., a hardware or a software component) of the electronic device 301 coupled with the processor 320 and may perform various data processing or computations.

As at least part of the data processing or computations, the processor 320 may load a command or data received from another component (e.g., the sensor module 376 or the communication module 390) in volatile memory 332, process the command or the data stored in the volatile memory 332, and store resulting data in non-volatile memory 334. The processor 320 may include a main processor 321 (e.g., a central processing unit (CPU) or an application processor (AP)), and an auxiliary processor 323 (e.g., a graphics processing unit (GPU), an image signal processor (ISP), a sensor hub processor, or a communication processor (CP)) that is operable independently from, or in conjunction with, the main processor 321. Additionally or alternatively, the auxiliary processor 323 may be adapted to consume less power than the main processor 321, or execute a particular function. The auxiliary processor 323 may be implemented as being separate from, or a part of, the main processor 321.

The auxiliary processor 323 may control at least some of the functions or states related to at least one component (e.g., the display device 360, the sensor module 376, or the communication module 390) among the components of the electronic device 301, instead of the main processor 321 while the main processor 321 is in an inactive (e.g., sleep) state, or together with the main processor 321 while the main processor 321 is in an active state (e.g., executing an application). The auxiliary processor 323 (e.g., an image signal processor or a communication processor) may be implemented as part of another component (e.g., the camera module 380 or the communication module 390) functionally related to the auxiliary processor 323.

The memory 330 may store various data used by at least one component (e.g., the processor 320 or the sensor module 376) of the electronic device 301. The various data may include, for example, software (e.g., the program 340) and input data or output data for a command related thereto. The memory 330 may include the volatile memory 332 or the non-volatile memory 334. Non-volatile memory 334 may include internal memory 336 and/or external memory 338.

The program 340 may be stored in the memory 330 as software, and may include, for example, an operating system (OS) 342, middleware 344, or an application 346.

The input device 350 may receive a command or data to be used by another component (e.g., the processor 320) of the electronic device 301, from the outside (e.g., a user) of the electronic device 301. The input device 350 may include, for example, a microphone, a mouse, or a keyboard.

The sound output device 355 may output sound signals to the outside of the electronic device 301. The sound output device 355 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 360 may visually provide information to the outside (e.g., a user) of the electronic device 301. The display device 360 may include, for example, a display, a hologram device, or a projector and control circuitry to control a corresponding one of the display, hologram device, and projector. The display device 360 may include touch circuitry adapted to detect a touch, or sensor circuitry (e.g., a pressure sensor) adapted to measure the intensity of force incurred by the touch.

The audio module 370 may convert a sound into an electrical signal and vice versa. The audio module 370 may obtain the sound via the input device 350 or output the sound via the sound output device 355 or a headphone of an external electronic device 302 directly (e.g., wired) or wirelessly coupled with the electronic device 301.

The sensor module 376 may detect an operational state (e.g., power or temperature) of the electronic device 301 or an environmental state (e.g., a state of a user) external to the electronic device 301, and then generate an electrical signal or data value corresponding to the detected state. The sensor module 376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 377 may support one or more specified protocols to be used for the electronic device 301 to be coupled with the external electronic device 302 directly (e.g., wired) or wirelessly. The interface 377 may include, for example, a high-definition multimedia interface (HDMI), a universal serial bus (USB) interface, a secure digital (SD) card interface, or an audio interface.

A connecting terminal 378 may include a connector via which the electronic device 301 may be physically connected with the external electronic device 302. The connecting terminal 378 may include, for example, an HDMI connector, a USB connector, an SD card connector, or an audio connector (e.g., a headphone connector).

The haptic module 379 may convert an electrical signal into a mechanical stimulus (e.g., a vibration or a movement) or an electrical stimulus which may be recognized by a user via tactile sensation or kinesthetic sensation. The haptic module 379 may include, for example, a motor, a piezoelectric element, or an electrical stimulator.

The camera module 380 may capture a still image or moving images. The camera module 380 may include one or more lenses, image sensors, image signal processors, or flashes. The power management module 388 may manage power supplied to the electronic device 301. The power management module 388 may be implemented as at least part of, for example, a power management integrated circuit (PMIC).

The battery 389 may supply power to at least one component of the electronic device 301. The battery 389 may include, for example, a primary cell which is not rechargeable, a secondary cell which is rechargeable, or a fuel cell.

The communication module 390 may support establishing a direct (e.g., wired) communication channel or a wireless communication channel between the electronic device 301 and the external electronic device (e.g., the electronic device 302, the electronic device 304, or the server 308) and performing communication via the established communication channel. The communication module 390 may include one or more communication processors that are operable independently from the processor 320 (e.g., the AP) and supports a direct (e.g., wired) communication or a wireless communication. The communication module 390 may include a wireless communication module 392 (e.g., a cellular communication module, a short-range wireless communication module, or a global navigation satellite system (GNSS) communication module) or a wired communication module 394 (e.g., a local area network (LAN) communication module or a power line communication (PLC) module). A corresponding one of these communication modules may communicate with the external electronic device via the first network 398 (e.g., a short-range communication network, such as BLUETOOTH™, wireless-fidelity (Wi-Fi) direct, or a standard of the Infrared Data Association (IrDA)) or the second network 399 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 392 may identify and authenticate the electronic device 301 in a communication network, such as the first network 398 or the second network 399, using subscriber information (e.g., international mobile subscriber identity (IMSI)) stored in the subscriber identification module 396.

The antenna module 397 may transmit or receive a signal or power to or from the outside (e.g., the external electronic device) of the electronic device 301. The antenna module 397 may include one or more antennas, and, therefrom, at least one antenna appropriate for a communication scheme used in the communication network, such as the first network 398 or the second network 399, may be selected, for example, by the communication module 390 (e.g., the wireless communication module 392). The signal or the power may then be transmitted or received between the communication module 390 and the external electronic device via the selected at least one antenna.

Commands or data may be transmitted or received between the electronic device 301 and the external electronic device 304 via the server 308 coupled with the second network 399. Each of the electronic devices 302 and 304 may be a device of a same type as, or a different type, from the electronic device 301. All or some of operations to be executed at the electronic device 301 may be executed at one or more of the external electronic devices 302, 304, or the server 308. For example, if the electronic device 301 should perform a function or a service automatically, or in response to a request from a user or another device, the electronic device 301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 301. The electronic device 301 may provide the outcome, with or without further processing of the outcome, as at least part of a reply to the request. To that end, a cloud computing, distributed computing, or client-server computing technology may be used, for example.

Figure 4:
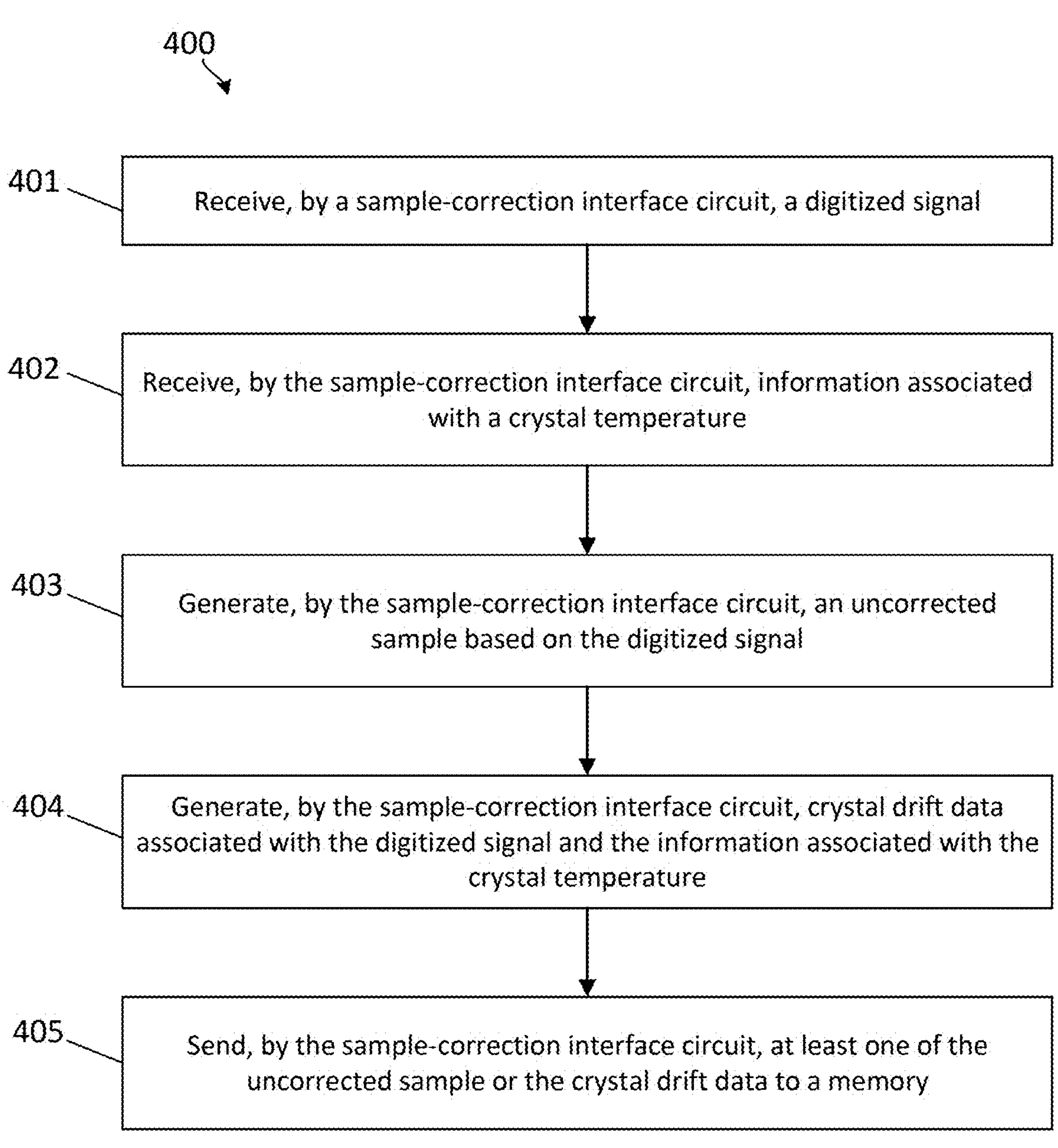
FIG. 4 is a flowchart depicting a method for frequency-drift correction, according to some embodiments of the present disclosure.

FIG. 4 is a flowchart depicting a method for frequency-drift correction, according to some embodiments of the present disclosure.

Referring to FIG. 4, a method 400 for frequency-drift correction may include one or more of the following operations. A sample-correction interface circuit 250 (scc FIGS. 2A and 2B) may receive a digitized signal (e.g., a digital signal) from an ADC 208 (operation 401). The sample-correction interface circuit 250 may receive information associated with a crystal temperature (e.g., a crystal temperature received from an output of an oscillator circuit 214) (operation 402). The sample-correction interface circuit 250 may generate an uncorrected sample UCS (e.g., uncorrected samples) based on the digitized signal (operation 403). The sample-correction interface circuit 250 may generate crystal drift data associated with the digitized signal and the information associated with the crystal temperature (operation 404). The sample-correction interface circuit 250 may send at least one of the uncorrected sample UCS or the crystal drift data to a memory (operation 405).

The present disclosure is not limited to the sequence or number of the operations of the method 400 shown in FIG. 4, and can be altered into any desired sequence or number of operations as recognized by a person of ordinary skill in the art. For example, in some embodiments, the order may vary, some processes thereof may be performed concurrently or sequentially, or the method 400 may include fewer or additional operations.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A method for frequency-drift correction, the method comprising:

receiving, by a sample-correction interface circuit, a digitized signal;

receiving, by the sample-correction interface circuit, information associated with a crystal temperature;

generating, by the sample-correction interface circuit, an uncorrected sample based on the digitized signal;

generating, by the sample-correction interface circuit, crystal drift data associated with the digitized signal and the information associated with the crystal temperature; and sending, by the sample-correction interface circuit, at least one of the uncorrected sample or the crystal drift data to a memory.

2. The method of claim 1, wherein:

the sample-correction interface circuit receives the information associated with the crystal temperature from an output of an oscillator circuit; and the uncorrected sample is generated by a receiver digital front end (RxFE) of the sample-correction interface circuit.

3. The method of claim 1, wherein:

the digitized signal is received from an analog-to-digital converter (ADC) of the sample-correction interface circuit; and the crystal drift data comprises crystal temperature data or a crystal drift value.

4. The method of claim 1, wherein the memory comprises a sample memory of a receiver comprising the sample-correction interface circuit.

5. The method of claim 1, wherein the memory comprises a supplementary memory that is external to a receiver comprising the sample-correction interface circuit.

6. The method of claim 1, further comprising:

generating, by the sample-correction interface circuit, time-alignment data;

sending, by the sample-correction interface circuit, the time-alignment data to the memory;

receiving, by a sample-correction circuit, the uncorrected sample from the memory; and generating, by the sample-correction circuit, a corrected sample based on the uncorrected sample.

7. The method of claim 6, further comprising re-quantizing, by a sample-processing circuit, the corrected sample to a bit width of the memory.

8. The method of claim 6, further comprising sending, by a sample-processing circuit, the corrected sample to a tracking channel.

9. The method of claim 6, wherein the sample-correction circuit receives the uncorrected sample from a ping-pong buffer communicatively coupled to a receiver digital front end (RxFE) of the sample-correction interface circuit.

10. The method of claim 1, further comprising sending, by the sample-correction interface circuit, the uncorrected sample and data indicating a frequency drift to a sample-correction circuit that is external to a device comprising the sample-correction interface circuit.

11. The method of claim 10, wherein the frequency drift is determined as a function of a local clock time of the device.

12. A device for frequency-drift correction, the device comprising:

a processing circuit; and a crystal communicatively coupled to the processing circuit, wherein the processing circuit is configured to perform:

receiving a digitized signal;

receiving information associated with a temperature of the crystal;

generating an uncorrected sample based on the digitized signal;

generating crystal drift data associated with the digitized signal and the information associated with the temperature of the crystal; and sending at least one of the uncorrected sample or the crystal drift data to a memory.

13. The device of claim 12, wherein the uncorrected sample is generated by a receiver digital front end (RxFE).

14. The device of claim 12, wherein the digitized signal is received from an analog-to-digital converter (ADC).

15. The device of claim 12, wherein the memory comprises:

a sample memory of a receiver; or a supplementary memory that is external to the receiver.

16. The device of claim 12, wherein the processing circuit is configured to perform:

generating time-alignment data;

sending the time-alignment data to the memory;

receiving the uncorrected sample from the memory; and generating a corrected sample based on the uncorrected sample.

17. The device of claim 16, wherein the processing circuit is configured to perform re-quantizing the corrected sample to a bit width of the memory.

18. The device of claim 16, wherein the processing circuit is configured to perform sending the corrected sample to a tracking channel.

19. The device of claim 16, wherein the processing circuit receives the uncorrected sample from a ping-pong buffer communicatively coupled to a receiver digital front end (RxFE).

20. A system for frequency-drift correction, the system comprising:

a processing circuit; and a memory communicatively coupled to the processing circuit, and storing instructions that, when executed by the processing circuit, cause the processing circuit to perform:

receiving a digitized signal;

receiving information associated with a crystal temperature;

generating an uncorrected sample based on the digitized signal;

generating crystal drift data associated with the digitized signal and the information associated with the crystal temperature; and sending at least one of the uncorrected sample or the crystal drift data to a memory.

* * * * *